United States Patent
Marsili et al.

(10) Patent No.: US 10,855,095 B2
(45) Date of Patent: Dec. 1, 2020

(54) BATTERY IMPEDANCE DETECTION USING VOLTAGE AND CURRENT MEASUREMENTS

(71) Applicant: Infineon Technologies AG, Neubiberg (DE)

(72) Inventors: Stefano Marsili, Faak am See (AT); Michael Kropfitsch, Koettmannsdorf (AT)

(73) Assignee: Infineon Technologies AG, Neubiberg (DE)

( * ) Notice: Subject to any disclaimer, the term of this patent is extended or adjusted under 35 U.S.C. 154(b) by 265 days.

(21) Appl. No.: 15/782,340

(22) Filed: Oct. 12, 2017

(65) Prior Publication Data
US 2019/0115762 A1    Apr. 18, 2019

(51) Int. Cl.
| | | |
|---|---|---|
| H02J 7/00 | (2006.01) | |
| H01M 10/42 | (2006.01) | |
| G01R 31/3842 | (2019.01) | |
| H01M 10/48 | (2006.01) | |

(52) U.S. Cl.
CPC .......... *H02J 7/007* (2013.01); *G01R 31/3842* (2019.01); *H01M 10/42* (2013.01); *H01M 10/425* (2013.01); *H01M 10/48* (2013.01)

(58) Field of Classification Search
CPC .................................................... H02J 7/007
USPC ........................................................ 320/107
See application file for complete search history.

(56) References Cited

U.S. PATENT DOCUMENTS

| | | | |
|---|---|---|---|
| 6,002,238 A | | 12/1999 | Champlin |
| 6,133,709 A | * | 10/2000 | Puchianu .............. B60L 3/0046 320/116 |
| 8,648,602 B2 | | 2/2014 | van Lammeren |
| 2005/0017685 A1 | * | 1/2005 | Rees .................... G01R 31/392 320/132 |
| 2012/0155507 A1 | | 6/2012 | Srinivasan et al. |

(Continued)

FOREIGN PATENT DOCUMENTS

| | | |
|---|---|---|
| CN | 1558253 A | 12/2004 |
| CN | 101666861 A | 3/2010 |

(Continued)

OTHER PUBLICATIONS

Fang et al., "Simple Complex Impedance Measurement Method," from Shanxi Electronic Technology, Jun. 30, 2012, 3 pp. (English abstract only).

(Continued)

*Primary Examiner* — Yalkew Fantu
(74) *Attorney, Agent, or Firm* — Shumaker & Sieffert, P.A.

(57) ABSTRACT

A method is disclosed, which includes driving an alternating input current into a battery, measuring a voltage across the battery by a first measurement circuit to obtain a voltage measurement value, measuring a current through the battery by a second measurement circuit to obtain a current measurement value, and measuring a current through the battery using the first measurement circuit to obtain a further current measurement value. Further, the method includes calculating an impedance of the battery based on the current measurement value, the further current measurement value, and the voltage measurement value.

25 Claims, 5 Drawing Sheets

(56) References Cited

U.S. PATENT DOCUMENTS

2015/0198675 A1* 7/2015 Hebiguchi .......... H01M 10/486
                                                  324/430
2016/0349329 A1* 12/2016 Wada ................... G01R 31/367
2017/0016962 A1* 1/2017 Iwane .................. G01R 31/374

FOREIGN PATENT DOCUMENTS

| CN | 102129042 A | 7/2011 |
| CN | 102809691 A | 12/2012 |
| CN | 104155611 A | 11/2014 |
| CN | 205280824 U | 6/2016 |
| CN | 106133994 A | 11/2016 |
| CN | 106371029 A | 2/2017 |
| CN | 106526321 A | 3/2017 |

OTHER PUBLICATIONS

Liu et al., "Storage Battery Internal Resistance Measurement Based on Direct Sampling Phase Shifting Method," Telecon Power Technology, vol. 29, No. 3, May 2012, 3 pp. (English Abstract only).
Office Action, in the Chinese language, from counterpart Chinese Application No. 201811191606.2, dated Sep. 29, 2020, 9 pp.

\* cited by examiner

BATTERY IMPEDANCE DETECTION USING VOLTAGE AND CURRENT MEASUREMENTS

TECHNICAL FIELD

This disclosure relates in general to detecting or measuring the impedance of a battery. In particular, this disclosure relates to a method and an electronic circuit for detecting the impedance of a battery.

BACKGROUND

The complex impedance of a battery, such as a lithium-ion (Li-ion) battery, may be used to obtain information on the status of the battery. This information may include a temperature, charging state or information on a deterioration, to name only a few. Obtaining this information based on the impedance makes use of the fact that the impedance varies as the frequency of a current driven into the battery or drawn from the battery varies. Measuring the temperature, for example, may include driving alternating currents with different frequencies into the battery, measuring the complex impedance of the battery at each of the different frequencies and detecting the temperature based on the complex impedance, more specifically, based on the imaginary part of the complex impedance obtained at the different frequencies.

Obtaining status information of the battery based on the impedance requires a reliable impedance measurement. There is therefore a need for reliably measuring the impedance of a battery.

SUMMARY

One example relates to a method. The method includes driving an alternating input current into a battery, measuring a voltage across the battery by a first measurement circuit to obtain a voltage measurement value, measuring a current through the battery by a second measurement circuit to obtain a current measurement value, and measuring a current through the battery using the first measurement circuit to obtain a further current measurement value. The method further includes calculating an impedance of the battery using the current measurement value, the further current measurement value, and the voltage measurement value.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
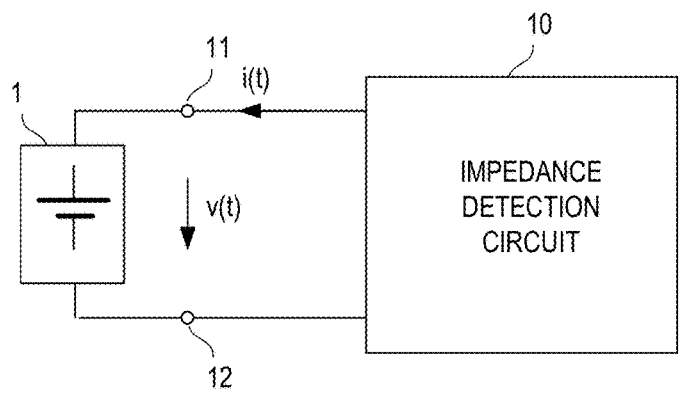
FIG. 1 schematically illustrates an arrangement with a battery and an impedance detection circuit connected to the battery and configured to detect an impedance of the battery.

FIG. 1 schematically illustrates an arrangement with a battery 1 and an impedance temperature detection circuit 10. The impedance detection circuit 10 is connected to a first battery node 11 and a second battery node 12 of the battery 1 and is configured to detect an impedance of the battery 1 in a way explained in further detail herein below.

Figure 2A:
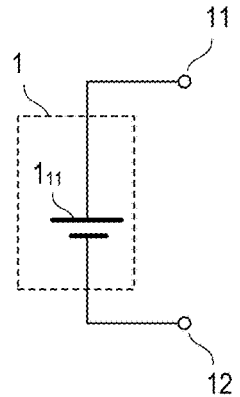
FIGS. 2A-2D show different examples of a battery.
Figure 2B:
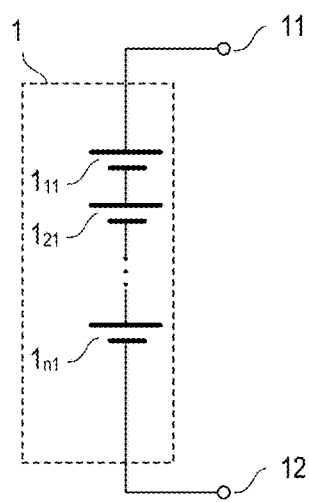
Figure 2C:
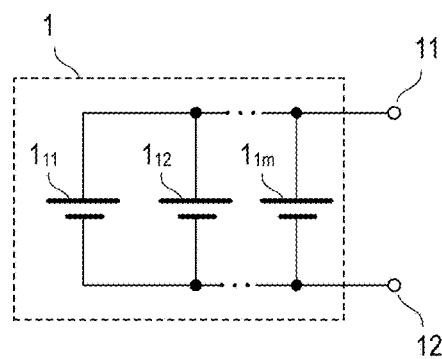
Figure 2D:
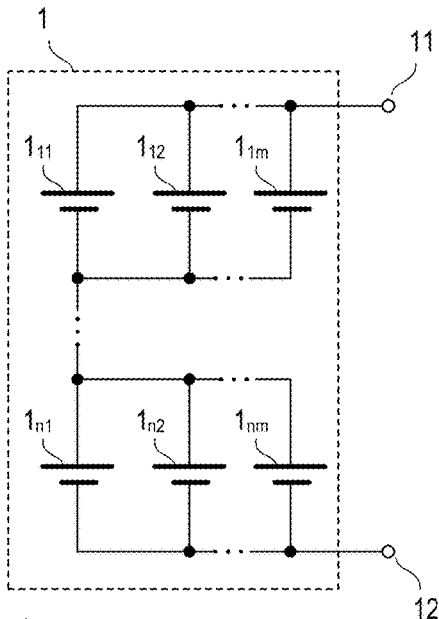

The battery 1 is a lithium-ion (Li-ion) battery, for example. The battery 1 includes at least one battery cell. Some examples of how the battery 1 may be implemented are illustrated in FIGS. 2A to 2D. Referring to FIG. 2A, the battery 1 may include one battery cell $1_{11}$ connected between the first battery node 11 and the second battery node 12. According to another example shown in FIG. 2B, the battery 1 includes a plurality of battery cells $1_{11}$, $1_{21}$, $1_{n1}$ connected in series between the first battery node 11 and the second battery node 12. According to another example shown in FIG. 2C, the battery 1 includes a plurality of battery cells $1_{11}$, $1_{12}$, $1_{1m}$ connected in parallel between the first battery node 11 and the second battery node 12. According to yet another example shown in FIG. 2D, the battery 1 includes a series circuit with two or more parallel circuits, wherein each of these parallel circuits includes two or more battery cells $1_{11}$, $1_{12}$, $1_{1m}$, $1_{n1}$, $1_{n2}$, $1_{nm}$.

Basically, detecting a complex impedance Z(f) of the battery 1 by the impedance detection circuit 10 includes driving an alternating current i(t) via the battery nodes 11, 12 into the battery 1, measuring a voltage v(t) between the battery nodes 11, 12, measuring the current i(t) and calculating the impedance based on these measurements.

As used herein, an "alternating current" is a current that includes an alternating current component and that, additionally, may include a direct current (DC) offset. According to one example, the alternating current component is a sinusoidal current component. In the following, an alternating current with a sinusoidal current component is referred to as sinusoidal current. A sinusoidal input current i(t) is given by $$i(t) = I_{DC} + I_0 \cdot \sin(\omega t + \varphi 0) \qquad (1),$$

where $I_0$ is an amplitude of the sinusoidal current component, $\omega = 2\pi \cdot f$, with f being the frequency at which the impedance is to be measured, $\varphi 0$ is a phase shift and $I_{DC}$ is the optional DC offset. As used herein, "driving a current into the battery" may include driving only a positive current that charges the battery, only a negative current that discharges the battery, or alternatingly a positive current and a negative current. If in the example given in equation (1) the DC offset $I_{DC}$ is zero ($I_{DC}=0$), there are time periods when the current is positive so that the battery 1 is charged and time periods when the current is negative so that the battery is discharged, wherein over each period of the sinusoidal input current i(t) the charging state of the battery 1 does not change. According to another example, the DC offset Inc is different from zero and selected such that the input current is either only positive or only negative, wherein the current direction of the input current i(t) can be adjusted by selecting the sign (positive or negative) of the DC offset $I_{DC}$.

Using a sinusoidal current as the alternating input current i(t) is only an example. Alternating currents with alternating current components that have a waveform different from a sinusoidal waveform may be used as well. Examples of these other types of waveforms include, but are not restricted to, a rectangular waveform, a triangular waveform, a sine square waveform, or the like.

When the input current i(t) is, for example, a sinusoidal current as given in equation (1) the voltage v(t) between the battery nodes 11, 12 is an alternating voltage as follows:

$$v(t)=V_0+R1 \cdot I_{DC}+Z_0 \cdot I_0 \cdot \sin(\omega t+\varphi 0+\varphi)) \quad (2),$$

where $Z_0$ is the magnitude of a complex impedance of the battery 1, φ is a phase shift introduced by the complex impedance of the battery, and R1 represents the real part of the complex impedance. Further, $V_0$ is an optional offset of the battery voltage v(t). This offset $V_0$ represents a charging state of the battery 1, that is, $V_0$ is the voltage that can be measured between the battery nodes 11, 12 when no input current (i(t)=0) is driven into the battery 1. In the frequency domain, the voltage v(t) and the current i(t) can be written as:

$$V(f)=Z_0 \cdot I_0 \cdot e^{j(\varphi 0+\varphi)} \quad (3a)$$

$$I(f)=I_{DC}+I_0 \cdot e^{j\varphi 0} \quad (3b).$$

If f=0, V(f) according to equation (3a) is given by $V(f)=V_0+R1 \cdot I_{DC}$. In the following, evaluating (measuring) the impedance Z(f) at a frequency different from zero will be explained, that is, f≠0. In this context, the term $Z_0 \cdot I_0 \cdot e^{j(\varphi 0+\varphi)}$ in equation (3a) is referred to as the AC component $V_{AC}$ of the voltage V(f), and in equation (3b), $I_0 \cdot e^{j\varphi 0}$ is referred to as AC component $I_{AC}(f)$ of the current I(f). In each of these formulae, f denotes an arbitrary frequency at which the impedance is to be measured. The complex impedance Z(f) of the battery at f≠0 is given by the quotient of these AC components, that is, $$Z(f) = \frac{V_{AC}(f)}{I_{AC}(f)} = \frac{Z_0 \cdot I_0 \cdot e^{j(\varphi 0+\varphi)}}{I_0 \cdot e^{j\varphi 0}} = Z_0 \cdot e^{j\varphi}. \quad (4a)$$

This complex impedance may also be expressed as $$Z(f)=Z_0 \cdot e^{j\varphi}=Re\{Z(f)\}+j \cdot Im\{Z(f)\}=Z_0 \cos \varphi + j \cdot Z_0 \sin \varphi \quad (4b),$$

where Re{Z(f)} is the real part and Im{Z(f)} is the imaginary part of the complex battery impedance Z(f), and j is the imaginary unit. The real part Re{Z(f)} can also be referred to as resistance and the imaginary part Im{Z(f)} can also be referred to as reactance of the battery 1. The impedance Z(f) is dependent on the frequency f of the input current i(t), so that the magnitude $Z_0$ and the phase φ of the impedance Z(f) are also dependent on the frequency (are a function of the frequency), that is, $Z_0=Z_0(f)$ and φ=φ(f).

Measurement circuits that are suitable to measure the voltage across the battery 1 and the current through the battery may introduce a phase shift and have a gain different from one so that the AC component of the voltage V(f) when measured by a first measurement circuit may be in the form of $$V_{AC}(f)=A \cdot e^{j\alpha} \cdot Z_0 \cdot I_0 \cdot e^{j(\varphi 0+\varphi)} \quad (5a),$$

and the AC component of the current I(f) when measured by a second measurement circuit may be in the form of $$I_{AC}(f)=B \cdot e^{j\beta} \cdot I_0 \cdot e^{j\varphi 0} \quad (5b),$$

where A is the gain of the first measurement circuit, B is the gain of the second measurement circuit, α is the phase shift introduced by the first measurement circuit, and β is the phase shift introduced by the second measurement circuit. If the first and second measurement circuits are identical, so that A=B and α=β, applying equation (4a) to the measurement values given in equations (5a) and (5b) results in the correct impedance Z(f). If however, the measurement circuits are not identical, the impedance obtained from the measurement values and applying equation (4a) includes a measurement error and is given as $$Z(f) = \frac{V_{AC}(f)}{I_{AC}(f)} = \frac{A \cdot e^{j\alpha} \cdot Z_0 \cdot I_0 \cdot e^{j(\varphi 0+\varphi)}}{B \cdot e^{j\beta} \cdot I_0 \cdot e^{j\varphi 1}} = \frac{A}{B} e^{j(\alpha-\beta)} \cdot (Z_0 \cdot e^{j\varphi}), \quad (6)$$

where $\frac{A}{B} e^{j(\alpha-\beta)}$ where A/B $e^{j(\alpha-\beta)}$ represents the measurement error, where A/B is a gain introduced by the measurement circuits and α-β is a phase shift introduced by the measurement circuits.

Figure 3:
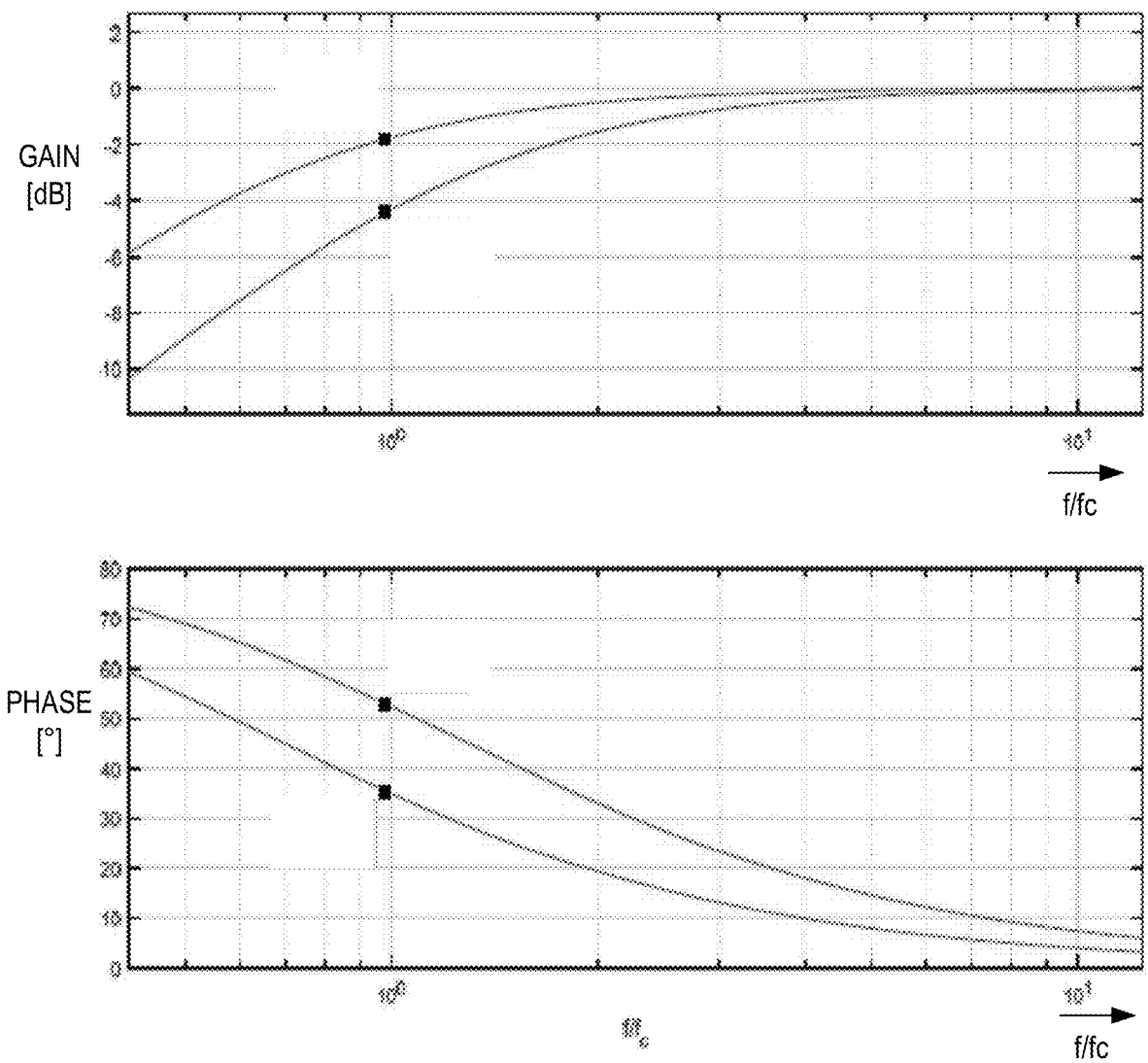
FIG. 3 schematically illustrates how gain and phase of a filter that may be used in an impedance detection circuit may vary.

Even if the first and second measurement circuits are designed identically, gain and phase may be different due to inevitable variations of components implemented in the measurement circuits. This is explained with reference to FIG. 3. FIG. 3 illustrates gain and phase of two different high pass filters over the frequency. High pass filters of this type may be implemented in the measurement circuits. These high pass filters are designed identically. Nevertheless, in this example, at the corner frequency fc, a difference between the gains is 2.6 dB and a difference between the phases is 18°.

Figure 4:
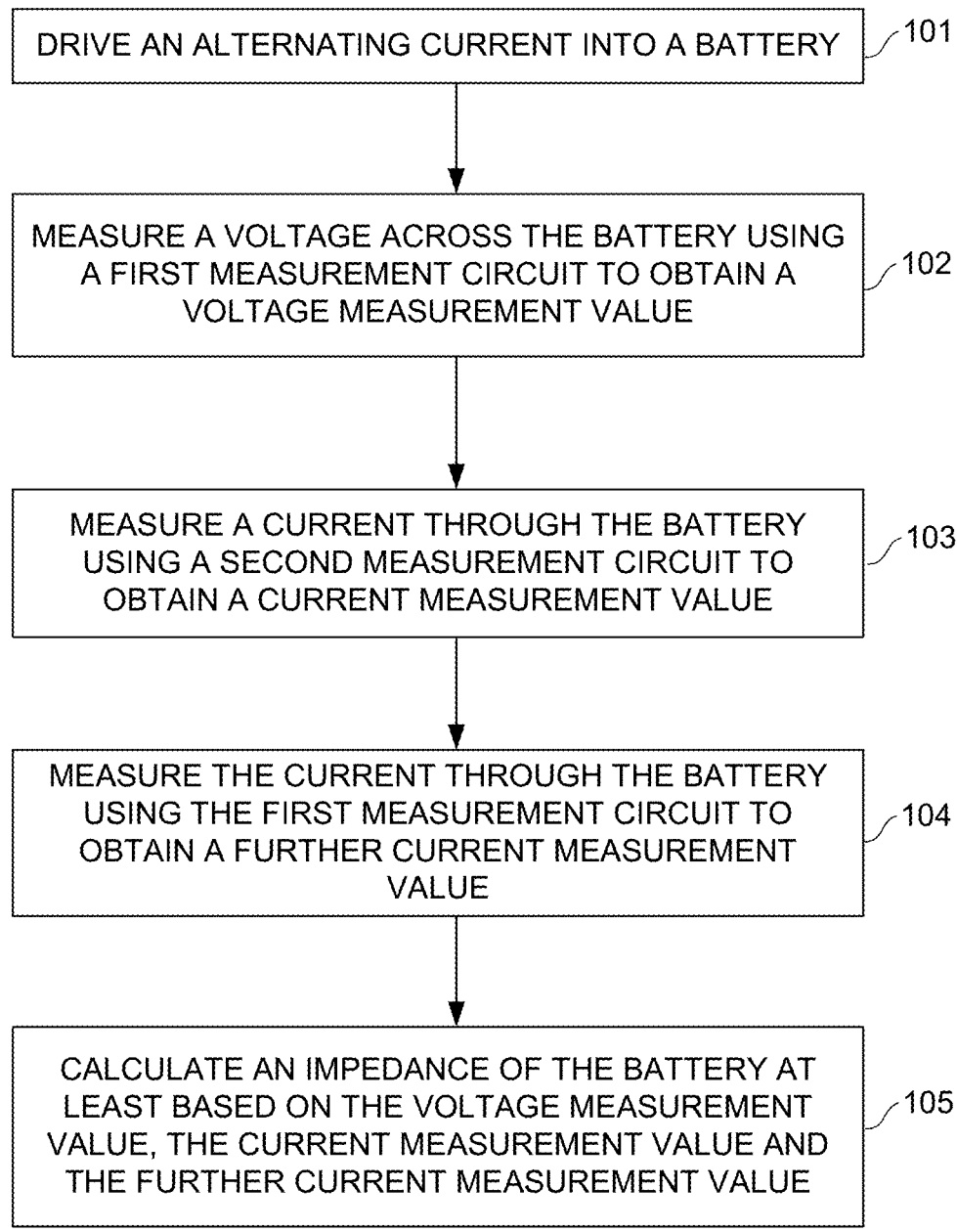
FIG. 4 is a flowchart that illustrates one example of a method for detecting the impedance of a battery.

There is therefore a need to precisely detect the impedance of a battery based on measuring the voltage across the battery 1 and the current through the battery 1 using two different measurement circuits. FIG. 4 illustrates a flowchart of a method suitable to precisely detect the battery impedance.

Referring to FIG. 4, the method includes driving an alternating current into the battery 1 (101). The alternating current may be an alternating current of any of the types explained herein above. With the current being driven into the battery, the method further includes measuring a voltage across the battery 1 using a first measurement circuit to obtain a voltage measurement value (102), and measuring the current through the battery 1 using a second measurement circuit to obtain a current measurement value. The voltage measurement value obtained by measuring the battery voltage using the first measurement circuit is referred to as first voltage measurement value in the following, and the current measurement value obtained by measuring the current into the battery using the second measurement circuit is referred to as second current measurement value in the following.

According to one example, the first voltage measurement value represents the alternating component of the voltage measured by the first measurement circuit across the battery 1, and the second current measurement value represents the alternating component of the current measured by the second measurement circuit. This first voltage measurement value is referred to as $V_{AC\_A}(A)$ in the following and this second current measurement value is referred to as $I_{AC}(B)$ in the following. According to one example, the first voltage measurement value $V_{AC}(A)$ and the second current measurement value $I_{AC}(B)$ are measured at the same time. This first voltage measurement value and this second current measurement value, like other voltage and current measurement values explained below, are dependent on the frequency of the alternating current. This dependency on the frequency, however, is not indicated in the variables that represent the individual measurement values.

Referring to FIG. 4, the method further includes a further measurement cycle 104. This further measurement cycle includes measuring the current through the battery 1 using the first measurement circuit to obtain a further current measurement value, which is referred to as first current measurement value $I_{AC}(A)$ in the following. According to one example, this first current measurement value represents the alternating component of the current measured by the first measurement circuit in the further measurement cycle. The first current measurement $I_{AC}(A)$ value may be measured by the first measurement circuit before or after the first voltage measurement value $V_{AC}(A)$.

According to one example, the first current measurement circuit has a gain A and a phase shift α, and the second current measurement circuit has a gain B and a phase shift β, so that the first voltage measurement value $V_{AC}(A)$, the second current measurement $I_{AC}(B)$ and the first current measurement value $I_{AC}(A)$ are given as follows:

$$V_{AC}(A)=A \cdot e^{j\alpha} \cdot Z_0 \cdot I_0 \cdot e^{j(\varphi 0+\varphi)} \quad (7a)$$

$$I_{AC}(B)=\cdot e^{j\beta} \cdot I_0 \cdot e^{j\varphi 0} \quad (7b)$$

$$I_{AC}(A)=A \cdot e^{j\alpha} \cdot I_0 \cdot e^{j\varphi 0} \quad (7c).$$

Referring to FIG. 4, the method further includes calculating the impedance of the battery 1 at least based on the (first) voltage measurement value $V_{AC}(A)$, the (second) current measurement value $I_{AC}(B)$ and the further (first) current measurement value $I_{AC}(A)$. According to one example, calculating the impedance includes calculating a gain and phase error introduced by the first and second measurement circuits based on the first and second current measurement values $I_{AC}(A)$, $I_{AC}(B)$. According to one example, calculating the gain and phase error includes calculating a quotient of the first and second current measurement values $I_{AC}(A)$, $I_{AC}(B)$, that is, $$D = \frac{I_{AC}(A)}{I_{AC}(B)} = \frac{A}{B} e^{j(\alpha-\beta)}, \quad (8)$$

where D denotes the ratio of the complex gains of the first current measurement circuit and the second current measurement circuit. This ratio D represents the gain error and the phase error introduced by the two current measurement circuits. Calculating the impedance further includes calculating the quotient of the first voltage measurement value $V_{AC}(A)$ and the second current measurement $I_{AC}(B)$ value in order to obtain a preliminary impedance value $Z_E$, which includes a gain and phase error, as follows:

$$Z_E = \frac{V_{AC}(A)}{I_{AC}(B)} = \frac{A \cdot e^{j\alpha} \cdot Z_0 \cdot I_0 \cdot e^{j(\varphi 0+\varphi)}}{B \cdot e^{j\beta} \cdot I_0 \cdot e^{j\varphi 0}} = \frac{A}{B} e^{j(\alpha-\beta)} \cdot Z_0 \cdot e^{j\varphi}. \quad (9)$$

It can be seen that this preliminary impedance value $Z_E$ is the complex gain and phase error D multiplied with the complex impedance $Z=Z_0 \cdot e^{j\pi}$ of the impedance. Thus, the method further includes obtaining the battery impedance by correcting the preliminary impedance value $Z_E$ using the complex gain and phase error D. In the example explained above, where the complex gain and phase error D is given by the quotient of the second current measurement value and the first current measurement value, correcting the preliminary impedance $Z_E$ includes dividing the preliminary impedance $Z_E$ by the complex gain and phase error as follows:

$$Z = \frac{Z_E}{D} = \frac{\frac{A}{B} e^{j(\alpha-\beta)} \cdot Z_0 \cdot e^{j\varphi}}{\frac{A}{B} e^{j(\alpha-\beta)}} = Z_0 \cdot e^{j\varphi}. \quad (10)$$

According to another example, the complex gain and phase error D is calculated by calculating the quotient of the second current measurement value $I_{AC}(B)$ and the first current measurement value $I_{AC}(A)$. In this case, the preliminary impedance value $Z_E$ is corrected by multiplying the preliminary impedance value $Z_E$ with the complex gain and phase error. D. As can be seen from equation (10), the battery impedance Z obtained by this method equals the battery impedance and is independent of gains and phases introduced by the measurement circuits.

Referring to the above, the first voltage measurement value $V_{AC}(A)$ and the second current measurement value $I_{AC}(B)$ may be obtained at the same time using the first and second current measurement circuits. This, however, is only an example. According to another example, the first and second current measurement values $I_{AC}(A)$, $I_{AC}(B)$ are obtained at the same time and the first voltage measurement $V_{AC}(A)$ value is obtained at another time before or after obtaining the first and second current measurement values $I_{AC}(A)$, $I_{AC}(B)$. Each of these methods is based on the assumption that the battery impedance does not change between the measurements.

According to another example, the method further includes measuring the voltage across the battery using the second measurement circuit in order to obtain a further voltage measurement value, which may represent the AC component of the voltage and is referred to as second voltage measurement circuit $V_{AC}(B)$ in the following. This second voltage measurement is given by:

$$V_{AC}(B)=B \cdot e^{j\beta} \cdot Z_0 \cdot I_0 \cdot e^{j(\varphi 0+\varphi)} \quad (11),$$

where B denotes the gain and β denotes the phase shift introduced by the second measurement circuit. Calculating the impedance based on the first and second voltage measurement values $V_{AC}(A)$, $V_{AC}(B)$ and the first and second current measurement values $I_{AC}(A)$, $I_{AC}(B)$ includes calculating a first impedance Z1 based on the first voltage measurement value $V_{AC}(A)$ and the second current measurement value $I_{AC}(B)$ and a second impedance Z2 based on the second voltage measurement value $V_{AC}(B)$ and the first current measurement value $I_{AC}(A)$ as follows:

$$Z1 = \frac{V_{AC}(A)}{I_{AC}(B)} = \frac{A \cdot e^{j\alpha} \cdot Z_0 \cdot I_0 \cdot e^{j(\varphi 0+\varphi)}}{B \cdot e^{j\beta} \cdot I_0 \cdot e^{j\varphi 0}} = \frac{A}{B} e^{j(\alpha-\beta)} \cdot Z_0 \cdot e^{j\varphi} \quad (12a)$$

$$Z2 = \frac{V_{AC}(B)}{I_{AC}(A)} = \frac{B \cdot e^{j\beta} \cdot Z_0 \cdot I_0 \cdot e^{j(\varphi 0+\varphi)}}{A \cdot e^{j\beta} \cdot I_0 \cdot e^{j\varphi 0}} = \frac{B}{A} e^{j(\beta-\alpha)} \cdot Z_0 \cdot e^{j\varphi}. \quad (12b)$$

The method further includes calculating the product Z1·Z2 of the first and second impedance Z1, Z2 and calculating the square root of the product in order to obtain the battery impedance Z, that is, $$Z = \sqrt{Z1 \cdot Z2} = \sqrt{\left(\frac{A}{B}e^{j(\alpha-\beta)} \cdot Z_0 \cdot e^{j\varphi}\right) \cdot \left(\frac{B}{A}e^{j(\beta-\alpha)} \cdot Z_0 \cdot e^{j\varphi}\right)} = \sqrt{Z_0^2 \cdot e^{j2\varphi}} = Z_0 \cdot e^{j\varphi}. \quad (13)$$

It can be seen from equation (13) that the square root of the product of the first impedance Z1 and the second impedance Z2 represents the battery impedance and is independent of gain and phase errors introduced by the first and second measurement circuits.

According to another example, calculating the battery impedance Z based on the first and the second impedance Z1, Z2 includes calculating a mean value of the first and second impedances as follows:

$$Z = \frac{Z1 + Z2}{2} = \frac{\mathrm{Re}\{Z1\} + \mathrm{Re}\{Z2\}}{2} + j\frac{\mathrm{Im}\{Z1\} + \mathrm{Im}\{Z2\}}{2} \quad (14a)$$

or $$Z = \frac{Z_{01} + Z_{02}}{2} \cdot e^{j(\varphi 1 + \varphi 2)/2}, \quad (14b)$$

where $Z_{01}$ (which equals $\frac{A}{B} \cdot Z_0$)

denotes the magnitude of the first impedance Z1, $Z_{02}$ (which equals $\frac{B}{A} \cdot Z_0$)

denotes the magnitude of the second impedance, φ1 (which equals α−β+φ) denotes the phase of the first impedance Z1, and φ2 (which equals β−α+φ) denotes the phase of the second impedance Z2. The complex impedance calculated in this way, however, may include a small residual gain and phase error introduced by the measurement circuits.

Figure 5:
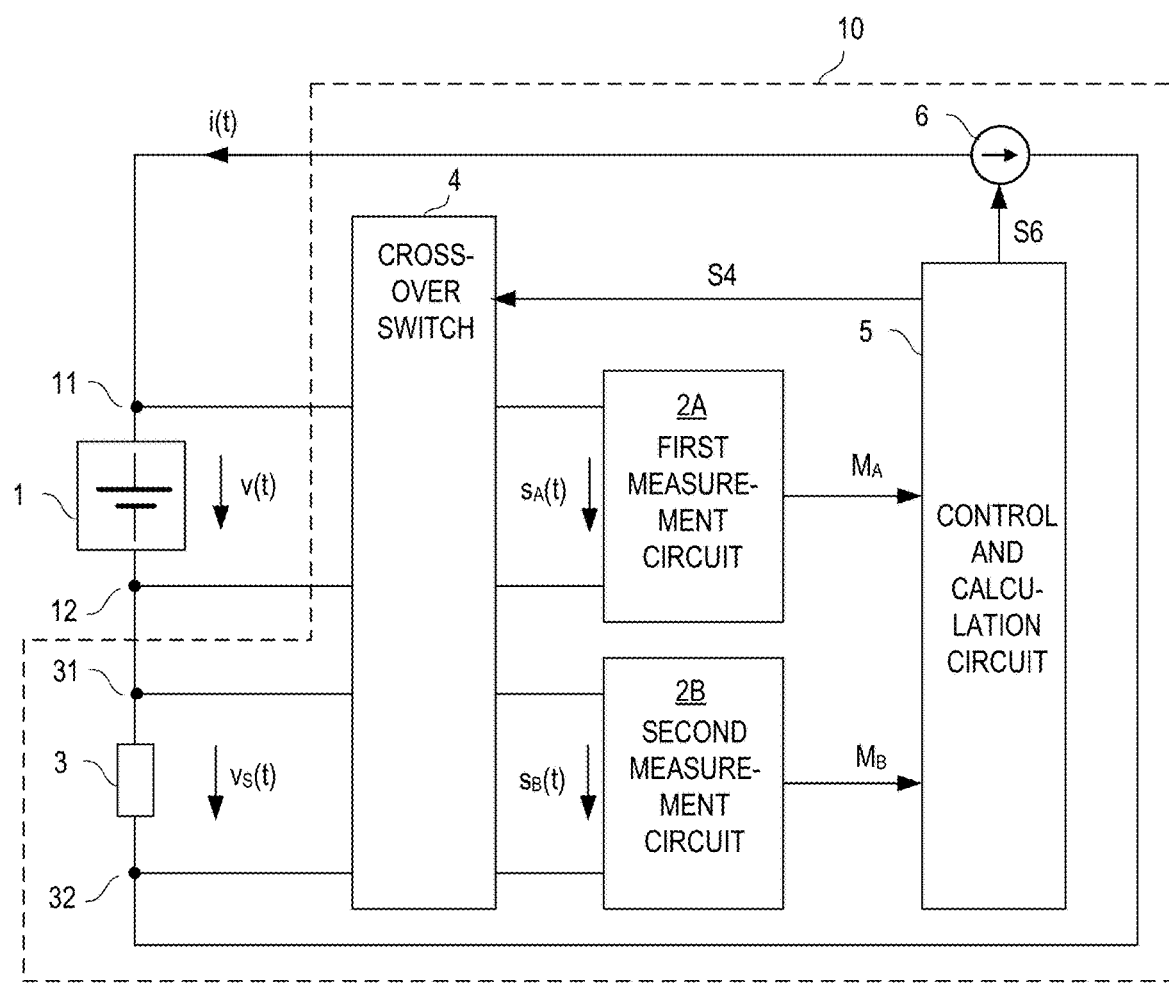
FIG. 5 shows one example of an impedance detection circuit.

FIG. 5 shows one example of an impedance detection circuit 10 configured to detect the battery impedance based on the method illustrated in FIG. 4. Referring to FIG. 5, the impedance detection circuit 10 includes a current sensor 3 connected in series with the battery 1. According to one example, the current sensor 3 includes a shunt resistor with a resistance R3. In this case, a voltage vs(t) across the current sensor 3 is given by R3·i(t), wherein i(t) is the current driven into the battery 1 by the impedance detection circuit 10. The impedance detection circuit 10 further includes a first measurement circuit 2A and a second measurement circuit 2B and a crossover switch 4 coupled between the battery 1 and the current sensor 3, on one side, and the first measurement circuit 2A and the second measurement circuit 2B, on the other side. The crossover switch 4 is controlled by a control and calculation circuit 5 and is configured to selectively couple the battery 1 with the first measurement circuit 2A or the second measurement circuit 2B and the current sensor 3 with the first measurement circuit 2A or the second measurement circuit 2B, wherein, at one time, only one of the battery 1 and the current sensor 3 is coupled to one of the measurement circuits 2A, 2B. In FIG. 5, $s_A(t)$ denotes an input signal of the first measurement circuit 2A, and $s_B(t)$ denotes an input signal of the second measurement circuit 2B. Dependent on a switching state of the cross over switch 4, the input signal $s_A(t)$ of the first measurement circuit 2A either equals the voltage v(t) across the battery 1 or the voltage $v_S(t)$ across the current sensor 3 and the input signal $s2_B(t)$ of the second measurement circuit 2 either equals the voltage v(t) across the battery 1 or the voltage $v_S(t)$ across the current sensor 3. Each of the first measurement circuit 2A and the second measurement circuit 2B is configured to generate a measurement value $M_A$, $M_B$ based on its input signal $s_A(t)$, $s_B(t)$. According to one example, each of the measurement values $M_A$, $M_B$ represents the AC component of the respective input signal $s_A(t)$, $s_B(t)$.

In the impedance detection circuit 10 shown in FIG. 5, the voltage across the battery 1 can be measured by the first measurement circuit 2A when the crossover switch 4 connects the first measurement circuit 2A with the battery 1, the current can be measured by the first measurement circuit 2A when the crossover switch 4 connects the first measurement circuit 2A with the current sensor 3, the voltage across the battery 1 can be measured by the second measurement circuit 2B when the crossover switch 4 connects the second measurement circuit 2B with the battery 1, and the current through the battery 1 can be measured by the second measurement circuit 2B when the crossover switch 4 connects the second measurement circuit 2B with the current sensor 3. A voltage measurement value obtained by measuring the battery voltage using the first measurement circuit 2A is referred to as first voltage measurement value in the following, a voltage measurement value obtained by measuring the battery voltage using the second measurement circuit 2B is referred to as second voltage measurement value in the following, a current measurement value obtained by measuring the voltage across the current sensor 3 using the first measurement circuit 2A is referred to as first current measurement value in the following, and a current measurement value obtained by measuring the voltage across the current sensor 3 using the second measurement circuit 2B is referred to as second current measurement value in the following. Thus, the measurement value $M_A$ output by the first measurement circuit 2A is the first voltage measurement value, when the first measurement circuit 2A is coupled to the battery 1, and the first current measurement value, when the first measurement circuit 2A is coupled to the current sensor 3. Equivalently, the measurement value $M_B$ output by the second measurement circuit 2B is the second voltage measurement value, when the second measurement circuit 2B is coupled to the battery 1, and the second current measurement value, when the second measurement circuit 2B is coupled to the current sensor 3. The first voltage measurement value and the first current measurement value are given by $$M_A = V_{AC}(A) = A \cdot e^{j\alpha} \cdot Z_0 \cdot e^{j(\varphi 0 + 0)} \quad (15a)$$

$$M_A = R3 \cdot I_{AC}(A) = R3 \cdot A \cdot e^{j\alpha} \cdot I_0 \cdot e^{j\varphi 0} \quad (15b),$$

where R3 denotes the resistance of the shunt resistor included in the current sensor 3. The second voltage measurement value and the second current measurement value are given by $$M_B = V_{AC}(B) = B \cdot e^{j\beta} \cdot Z_0 \cdot e^{j(\varphi 0 + \varphi)} \quad (16a)$$

$$M_B = R3 \cdot I_{AC}(B) = R3 \cdot B \cdot e^{j\beta} \cdot I_0 \cdot e^{j\varphi 0} \quad (16b).$$

Just for the purpose of illustration, it is assumed that the first voltage measurement value and the second current measurement value are measured at the same time and the first current measurement value and the second voltage measurement value are measured at the same time. The control and calculation circuit 5 receives the measurement values from the first and second measurement circuits 2A, 2B and calculates the impedance based on one of the methods explained herein above. It should be noted in this regard, that, for calculating the impedance, the first and second current measurement values and one of the first and second voltage measurement values is sufficient. Thus, the control and calculation circuit may only process the first and second current measurement values and one of the first and second voltage measurement values. Further, referring to equations (14b) and (15b), the first and second current measurement values output by the first and second measurement circuits 2A, 2B represent the AC components of the current through the battery multiplied with the resistance R3 of the shunt resistor. In this example, the control and calculation circuit 5 may divide the current measurement values received by the first and second measurement circuits 2A, 2B by the resistance R3 before processing the at least one voltage measurement value and the first and second current measurement values in accordance with any of the methods explained with reference to FIG. 4.

Referring to FIG. 5, the impedance detection circuit 10 further includes a current source 6 configured to generate the alternating current i(t). This current source 6 is controlled by the control and calculation circuit 5 using a signal S6. In particular, this signal S6 adjusts a frequency of the current generated by the current source 6.

Figure 6:
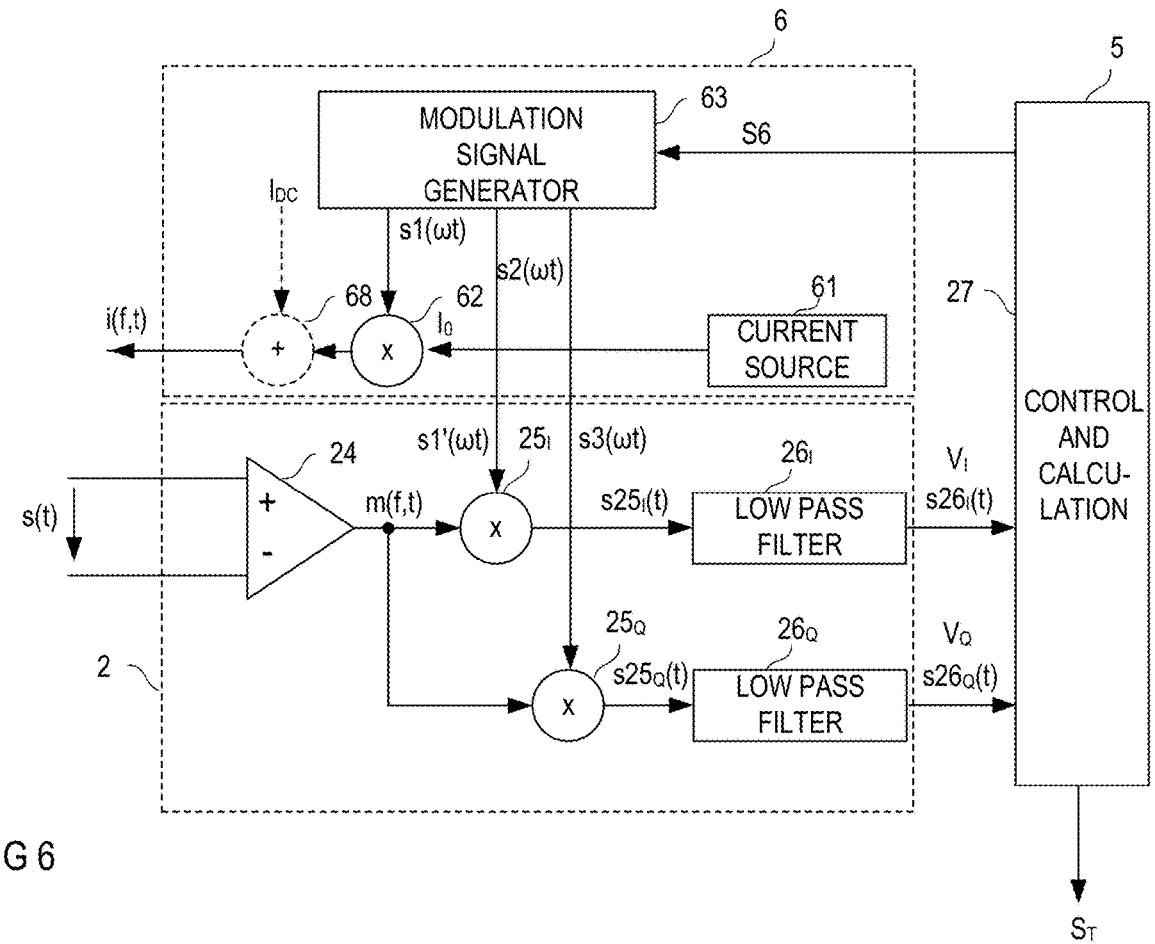
FIG. 6 shows, in greater detail, one example of a measurement circuit included in the impedance detection circuit shown in FIG. 5.

FIG. 6 shows one example of one of the first and second measurement circuits 2A, 2B. In FIG. 6, reference numeral 2 denotes any one of the two measurement circuits 2A, 2B, s(t) denotes the input signal received by the respective measurement circuit 2A, 2B and M represents the measurement value output by the respective measurement circuit 2A, 2B. Each of the first and second measurement circuits 2A, 2B may be implemented in accordance with FIG. 6. FIG. 6 shows a block diagram of the measurement circuit 2. Besides the measurement circuit 2, the current source 6 and the control and calculation circuit 5 are also illustrated in FIG. 6. It should be noted that this block diagram illustrates functional blocks of one measurement circuit 2, the current source 6, and the control and calculation circuit 5 rather than a specific implementation. These functional blocks can be implemented in various ways. According to one example, these functional blocks are implemented using dedicated circuitry, such as analog circuits, digital circuits or analog and digital circuits. According to another example, the impedance detection circuit 10 is implemented using hardware and software. For example, the impedance detection circuit 10 includes a microcontroller and software running on the microcontroller.

Referring to FIG. 6, the current source 6 includes a DC current source 61 configured to provide a direct current with a current level $I_0$. A modulator 62 connected downstream the DC current source 61 is configured to modulate the current $I_0$ provided by the DC current source 61 with a first alternating signal s1($\omega$t). Optionally, the DC offset $I_{DC}$ is added to an output signal of the modulator 62 by an optional adder 68. The current i(t) driven into the battery 1 (not shown in FIG. 6) is available at an output of the modulator 62 or an output of the adder 68. In general, this current i(t) is given by $$i(t)=I_{DC}+I_0\cdot s1(\omega t) \quad (17).$$

According to one example, the first alternating signal s1($\omega$t) is a sinusoidal signal, so that the input current i(t) is given by equation (1). This, however, is only an example. Other alternating signal waveforms such as a rectangular waveform may be used as well. The first alternating signal s1($\omega$t) is generated by a modulation signal generator 63 in accordance with a frequency signal S6 provided by the control and calculation circuit 5. The frequency signal S6 defines the frequency of the alternating signal s1($\omega$t) provided by the modulation signal generator 63.

Referring to FIG. 6, the measurement circuit 2 further includes a measurement unit 24 coupled to the input of the measurement circuit 2. The measurement unit is configured to receive the input signal s(t) and output a measurement signal m(t).

Referring to FIG. 6, a first low pass filter 261 is connected downstream the first demodulator $25_I$, and a second low pass filter $26_Q$ is connected downstream the second demodulator $25_Q$. The first demodulator $25_I$ receives a second alternating signal s2($\omega$t) and the second demodulator $25_Q$ receives a third alternating signal s2($\omega$t). The second and third alternating signals s2($\omega$t), s3($\omega$t) are selected such that there is a phase shift of $\pi/2$ (=90°) between these signals. The second alternating signal s2($\omega$t) may be in phase with the first alternating signal s1($\omega$t). This, however, is not mandatory. If there is a phase shift between the first signal s1($\omega$t) and the second signal s2($\omega$t) such phase shift can be considered as part of the phase shift introduced by the measurement circuit. According to one example, the second alternating signal s2($\omega$t) and the third alternating signal s3($\omega$t) have a sinusoidal waveform so that, for example, s2($\omega$t)=sin($\omega$t) and s3($\omega$t)=cos($\omega$t). In this case, output signals $s25_I(t)$, $s25_Q(t)$ of the demodulators $25_I$, $25_Q$ are as follows:

$$s25_I(t)=m(f,t)\cdot s2(\omega t)=m(f,t)\cdot \sin(\omega t) \quad (18a)$$

$$s25_Q(t)=m(f,t)\cdot s3(\omega t)=m(f,t)\cdot \cos(\omega t) \quad (18b).$$

If, for example, the input current i(t) is a sinusoidal current and the input signal s(t) represents the voltage v(t) across the battery 1 as given by equation (2), the demodulator output signals $s25_I(t)$, $s25_Q(t)$ are $$s25_I(t)=C\cdot[V_0+R1\cdot I_{DC}+Z_0\cdot I_0\cdot\sin(\omega t+\varphi_0+\varphi+\gamma)]\cdot\sin(\omega t) \quad (19a)$$

$$s25_Q(t)=C\cdot[V_0+R1\cdot I_{DC}+Z_0\cdot I_0\cdot\sin(\omega t+\varphi_0+\varphi+\gamma)]\cdot\cos(c\omega t) \quad (19b),$$

where C denotes the gain introduced by the measurement unit 24 and $\gamma$ represents a phase shift introduced by the measurement unit. It can be assumed that the gain and phase shift introduced by measurement circuit 2 is mainly introduced by the measurement unit 24, so that $\gamma=\alpha$ and C=A if the measurement circuit 2 is the first measurement circuit 2A and $\gamma=\beta$ and C=B if the measurement circuit is the second measurement circuit 2B.

The low pass filters $26_I$, $26_Q$ are configured to filter signal components with a frequency $\omega t$ and higher. Output signals $s26_I(t)$, $s26_Q(t)$, which are also referred to as inphase component $V_I$ and quadrature component $V_Q$ in the following, of these low pass filters $26_I$, $26_Q$ are then given by $$s26_I(t)=-Z_0\cdot I_0\cdot\cos(\varphi_0+\varphi+\gamma) \quad (20a)$$

$$s26_Q(t)=C\cdot Z_0\cdot I_0\cdot\sin(\varphi_0+\varphi+\gamma) \quad (20b),$$

which are the real part and the imaginary part of $C\cdot e^{j\gamma}\cdot Z_0\cdot I_0\cdot e^{j(\varphi 0+\varphi)}$, which is the first voltage measurement value if C=A and $\gamma=\alpha$ or the second voltage measurement value if C=B and $\gamma=\beta$. Equivalently, if the input signal represents the voltage across the shunt resistor, the low pass filter output signal $s26_I(t)$, $s26_Q(t)$ are given by $$s26_I(t)=R3\cdot C\cdot I_0\cdot\cos(\varphi_0+\gamma) \quad (21a)$$

$$s26_Q(t)=R3\cdot C\cdot I_0\cdot\sin(\varphi_0+\gamma) \quad (21b),$$

which are the real part and the imaginary part of $R3\cdot C\cdot e^{j\gamma}\cdot I_0\cdot e^{j(\varphi 0+\varphi)}$, which is R3 times the first current measurement value if C=A and γ=α or R3 times the second current measurement value if C=B and γ=β.

The following examples may illustrate one or more aspects of the disclosure.

Example 1

A method, including: driving an alternating input current into a battery; measuring a voltage across the battery by a first measurement circuit to obtain a voltage measurement value; measuring a current through the battery by a second measurement circuit to obtain a current measurement value; measuring a current through the battery using the first measurement circuit to obtain a further current measurement value; and calculating an impedance of the battery based on the current measurement value, the further current measurement value, and the voltage measurement value.

Example 2

The method of example 1, wherein obtaining the voltage measurement value and the current measurement value includes measuring the voltage across the battery by the first measurement circuit and the current through the battery by the second measurement circuit at a same time.

Example 3

The method of example 2, wherein obtaining the further current measurement value includes measuring the current through the battery by the second measurement circuit before or after obtaining the voltage measurement value and the current measurement value.

Example 4

The method of any combination of examples 1 to 3, wherein obtaining the current measurement value and the further current measurement value includes measuring the current through the battery by the first measurement circuit and the current through the battery by the second measurement circuit at a same time.

Example 5

The method of example 4, wherein obtaining the voltage measurement value includes measuring the voltage across the battery by the first measurement circuit before or after obtaining the current measurement value and the further current measurement value.

Example 6

The method of any combination of examples 1 to 5, wherein calculating the impedance of the battery includes: calculating a preliminary impedance based on the voltage measurement value and the current measurement value; calculating a gain and phase error based on the current measurement value and the further current measurement value; and calculating the impedance based on the preliminary impedance and the calculated gain and phase error.

Example 7

The method of example 6, wherein calculating the preliminary impedance includes calculating a quotient of the voltage measurement value and the current measurement value, and wherein calculating the gain and phase error includes calculating a quotient of the current measurement value and the further current measurement value.

Example 8

The method of any combination of examples 1 to 7, further including: measuring the voltage across the battery by a second measurement circuit to obtain a further voltage measurement value.

Example 9

The method of example 8, wherein calculating the impedance of the battery includes: calculating a first impedance based on the voltage measurement value and the current measurement value; calculating a second impedance based on the further voltage measurement value and the further current measurement value; and calculating the impedance based on the first impedance and the second impedance.

Example 10

The method of example 9, wherein calculating the impedance based on the first impedance and the second impedance includes: calculating a product of the first impedance and the second impedance; and calculating a square root of the product.

Example 11

The method of any combination of examples 9 and 10, wherein calculating the impedance based on the first impedance and the second impedance includes calculating a mean based on the first impedance and the second impedance.

Example 12

The method of example 11, wherein calculating the mean includes calculating a mean of real parts of the first impedance and the second impedance and calculating a mean of imaginary parts of the first impedance and the second impedance.

Example 13

The method of any combination of examples 11 and 12, wherein calculating the mean includes calculating a mean of magnitudes of the first impedance and the second impedance and a mean of phases of the first impedance and the second impedance.

Example 14

An electronic circuit, including: a first input configured to be coupled to a battery; a second input configured to be coupled to a current sensor; a first measurement circuit; a second measurement circuit; a crossover switch coupled to the first input, the second input, the first measurement circuit and the second measurement circuit and configured to selectively connect the first measurement circuit with one of the first input and the second input and the second measurement circuit with one of the first input and the second input; a control and calculation circuit configured to control the crossover switch and calculate an impedance of the battery based on measurement values received from the first measurement circuit and the second measurement circuit.

Example 15

The electronic circuit of example 14, wherein the measurement values include a voltage measurement value received from the first measurement circuit, a current measurement value received from the second measurement circuit, and a further current measurement value received from the first measurement circuit.

Example 16

The electronic circuit of example 15, wherein the control and calculation circuit is configured, in a first measurement cycle, to control the crossover switch such that the first measurement circuit is coupled to the first input and the second measurement circuit is coupled to the second input, to receive the voltage measurement value from the first measurement circuit, and to receive the current measurement value from the second measurement circuit, in a second measurement cycle, to control the crossover switch such that the first measurement circuit is coupled to the second input, and to receive the further current measurement value from the first measurement circuit.

Example 17

The electronic circuit of example 16, wherein the second measurement cycle is before or after the first measurement cycle.

Example 18

The electronic circuit of any combination of examples 15 to 17, wherein the control and calculation circuit is configured, in a first measurement cycle, to control the crossover switch such that the first measurement circuit is coupled to the second input and the second measurement circuit is coupled to the second input, to receive the current measurement value from the second measurement circuit, and to receive the further current measurement value from the first measurement circuit, in a second measurement cycle, to control the crossover switch such that the first measurement circuit is coupled to the first input, and to receive the voltage measurement value from the first measurement circuit.

Example 19

The electronic circuit of example 18, wherein the second measurement cycle is before or after the first measurement cycle.

Example 20

The electronic circuit of any combination of examples 15 to 19, wherein the control and calculation circuit being configured to calculate the impedance of the battery includes the control and calculation circuit being configured: to calculate a preliminary impedance based on the voltage measurement value and the current measurement value; to calculate a gain and phase error based on the current measurement value and the further current measurement value; and to calculate the impedance based on the preliminary impedance and the calculated gain and phase error.

Example 21

The electronic circuit of example 20, wherein the control and calculation circuit being configured to calculate the preliminary impedance includes the control and calculation circuit being configured to calculate a quotient of the voltage measurement value and the current measurement value, and wherein the control and calculation circuit being configured to calculate the gain and phase error includes the control and calculation circuit being configured to calculate a quotient of the current measurement value and the further current measurement value.

Example 22

The electronic circuit of any combination of examples 15 to 21, wherein the control and calculation circuit is further configured, in the second measurement cycle, to control the crossover switch such that the second measurement circuit is coupled to the first input, and to receive a further voltage measurement value from the second measurement circuit.

Example 23

The electronic circuit of example 22, wherein the control and calculation circuit being configured to calculate the impedance includes the control and calculation circuit being configured: to calculate a first impedance based on the voltage measurement value and the current measurement value; to calculate a second impedance based on the further voltage measurement value and the further current measurement value; and to calculate the impedance based on the first impedance and the second impedance.

Example 24

The method of example 23, wherein the control and calculation circuit being configured to calculate the impedance based on the first impedance and the second impedance includes the control and calculation circuit being configured:
to calculate a product of the first impedance and the second impedance; and
to calculate a square root of the product.

Example 25

The method of any combination of examples 23 and 24, wherein the control and calculation circuit being configured to calculate the impedance based on the first impedance and the second impedance comprises the control and calculation circuit being configured to calculate a mean based on the first impedance and the second impedance.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method comprising:
driving an alternating input current into a battery;
measuring a voltage across the battery by a first measurement circuit to obtain a voltage measurement value;
measuring a current through the battery by a second measurement circuit to obtain a first current measurement value;
measuring the current through the battery using the first measurement circuit to obtain a further current measurement value;
calculating a gain and phase error based on the first current measurement value and the further current measurement value; and
calculating an impedance of the battery based on the first current measurement value, the voltage measurement value, and the gain and phase error calculated based on the first current measurement value and the further current measurement value.

2. The method of claim 1, wherein obtaining the voltage measurement value and the first current measurement value comprises measuring the voltage across the battery by the first measurement circuit and the current through the battery by the second measurement circuit at a same time.

3. The method of claim 2, wherein obtaining the further current measurement value comprises measuring the current through the battery by the second measurement circuit before or after obtaining the voltage measurement value and the first current measurement value.

4. The method of claim 1, wherein obtaining the first current measurement value and the further current measurement value comprises measuring the current through the battery by the first measurement circuit and the current through the battery by the second measurement circuit at a same time.

5. The method of claim 4, wherein obtaining the voltage measurement value comprises measuring the voltage across the battery by the first measurement circuit before or after obtaining the first current measurement value and the further current measurement value.

6. The method of claim 1, wherein calculating the impedance of the battery comprises:
calculating a preliminary impedance based on the voltage measurement value and the first current measurement value; and
calculating the impedance based on the preliminary impedance and the calculated gain and phase error.

7. The method of claim 6,
wherein calculating the preliminary impedance comprises calculating a quotient of the voltage measurement value and the first current measurement value, and
wherein calculating the gain and phase error comprises calculating a quotient of the first current measurement value and the further current measurement value.

8. An electronic circuit comprising:
a first input configured to be coupled to a battery;
a second input configured to be coupled to a current sensor;
a first measurement circuit;
a second measurement circuit;
a crossover switch coupled to the first input, the second input, the first measurement circuit and the second measurement circuit and configured to selectively connect the first measurement circuit with one of the first input and the second input and the second measurement circuit with one of the first input and the second input;
a control and calculation circuit configured to:
control the crossover switch;
calculate a gain and phase error based on a first current measurement value received from the second measurement circuit and a further current measurement value received from the first measurement circuit; and
calculate an impedance of the battery based on a voltage measurement value received from the first measurement circuit, the first current measurement value received from the second measurement circuit, and the gain and phase error calculated based on the first current measurement value and the further current measurement value.

9. The electronic circuit of claim 8, wherein the control and calculation circuit is configured,
in a first measurement cycle, to control the crossover switch such that the first measurement circuit is coupled to the first input and the second measurement circuit is coupled to the second input, to receive the voltage measurement value from the first measurement circuit, and to receive the first current measurement value from the second measurement circuit, and
in a second measurement cycle, to control the crossover switch such that the first measurement circuit is coupled to the second input, and to receive the further current measurement value from the first measurement circuit.

10. The electronic circuit of claim 9, wherein the second measurement cycle is before or after the first measurement cycle.

11. The electronic circuit of claim 8, wherein the control and calculation circuit is configured,
in a first measurement cycle, to control the crossover switch such that the first measurement circuit is coupled to the second input and the second measurement circuit is coupled to the second input, to receive the first current measurement value from the second measurement circuit, and to receive the further current measurement value from the first measurement circuit,
in a second measurement cycle, to control the crossover switch such that the first measurement circuit is coupled to the first input, and to receive the voltage measurement value from the first measurement circuit.

12. The electronic circuit of claim 11, wherein the second measurement cycle is before or after the first measurement cycle.

13. The electronic circuit of claim 8, wherein the control and calculation circuit being configured to calculate the impedance of the battery comprises the control and calculation circuit being configured:
to calculate a preliminary impedance based on the voltage measurement value and the first current measurement value; and
to calculate the impedance based on the preliminary impedance and the calculated gain and phase error.

14. The electronic circuit of claim 13,
wherein the control and calculation circuit being configured to calculate the preliminary impedance comprises the control and calculation circuit being configured to calculate a quotient of the voltage measurement value and the first current measurement value, and wherein the control and calculation circuit being configured to calculate the gain and phase error comprises the control and calculation circuit being configured to calculate a quotient of the first current measurement value and the further current measurement value.

15. The electronic circuit of claim 8,
wherein the voltage measurement value is a first voltage measurement value, and
wherein the control and calculation circuit is further configured, in the second measurement cycle, to control the crossover switch such that the second measurement circuit is coupled to the first input, and to receive a further voltage measurement value from the second measurement circuit.

16. The electronic circuit of claim 15, wherein the control and calculation circuit being configured to calculate the impedance comprises the control and calculation circuit being configured:
to calculate a first impedance based on the first voltage measurement value and the current measurement value;
to calculate a second impedance based on the further voltage measurement value and the further current measurement value; and
to calculate the impedance based on the first impedance and the second impedance.

17. The electronic circuit of claim 16, wherein the control and calculation circuit being configured to calculate the impedance based on the first impedance and the second impedance comprises the control and calculation circuit being configured:
to calculate a product of the first impedance and the second impedance; and
to calculate a square root of the product.

18. The electronic circuit of claim 16, wherein the control and calculation circuit being configured to calculate the impedance based on the first impedance and the second impedance comprises the control and calculation circuit being configured to calculate a mean based on the first impedance and the second impedance.

19. A method comprising:
driving an alternating input current into a battery;
measuring a voltage across the battery by a first measurement circuit to obtain a first voltage measurement value;
measuring a current through the battery by a second measurement circuit to obtain a first current measurement value;
measuring the current through the battery using the first measurement circuit to obtain a further current measurement value;
measuring the voltage across the battery by a second measurement circuit to obtain a further voltage measurement value;
calculating a first impedance based on the first voltage measurement value and the first current measurement value;
calculating a second impedance based on the further voltage measurement value and the further current measurement value; and
calculating an impedance of the battery based on the first impedance and the second impedance.

20. The method of claim 19, wherein obtaining the voltage measurement value and the first current measurement value comprises measuring the voltage across the battery by the first measurement circuit and the current through the battery by the second measurement circuit at a same time.

21. The method of claim 19, wherein obtaining the first current measurement value and the further current measurement value comprises measuring the current through the battery by the first measurement circuit and the current through the battery by the second measurement circuit at a same time.

22. The method of claim 21, wherein calculating the mean comprises calculating a mean of real parts of the first impedance and the second impedance and calculating a mean of imaginary parts of the first impedance and the second impedance.

23. The method of claim 21, wherein calculating the mean comprises calculating a mean of magnitudes of the first impedance and the second impedance and a mean of phases of the first impedance and the second impedance.

24. The method of claim 19, wherein calculating the impedance based on the first impedance and the second impedance comprises:
calculating a product of the first impedance and the second impedance; and
calculating a square root of the product.

25. The method of claim 19, wherein calculating the impedance based on the first impedance and the second impedance comprises calculating a mean based on the first impedance and the second impedance.

* * * * *